June 5, 1962 J. W. CRIMMINS 3,038,123

VARIABLE BANDWIDTH DETECTOR

Filed May 19, 1960

INVENTOR
JAMES W. CRIMMINS
BY
Henry Huff
ATTORNEY

United States Patent Office 3,038,123
Patented June 5, 1962

3,038,123

VARIABLE BANDWIDTH DETECTOR

James W. Crimmins, Woodside, N.Y., assignor to Sperry Rand Corporation, Great Neck, N.Y., a corporation of Delaware Filed May 19, 1960, Ser. No. 31,484
4 Claims. (Cl. 328—138)

Figures 1, 2:
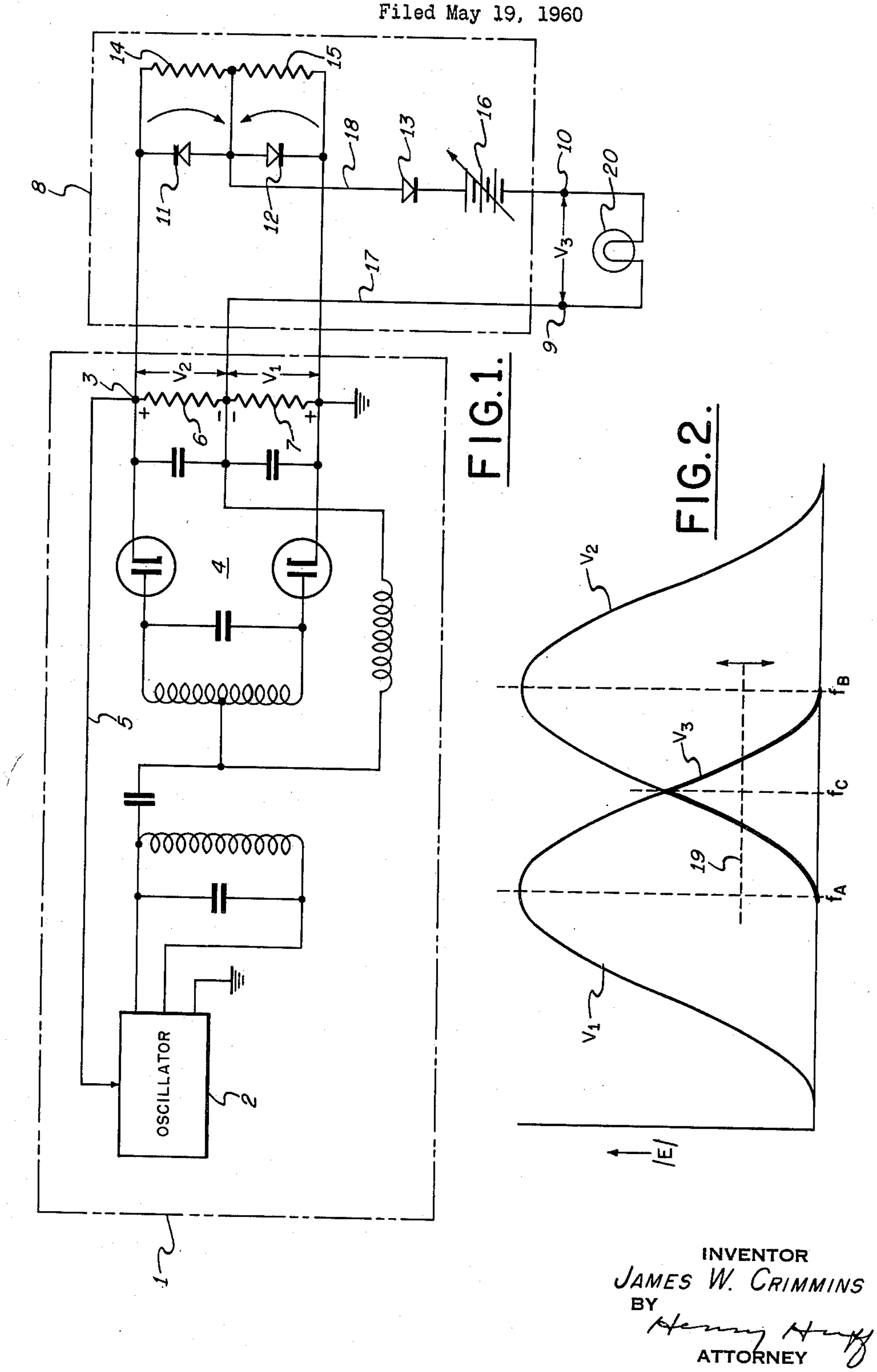

The invention generally relates to frequency sensitive detectors and, more particularly, to such a detector responsive to alternating signals over a controllable frequency bandwith which may be varied by an electrical signal.

It is the principal object of the present invention to provide an alternating signal detector having an electrically controllable bandwith response which does not require any adjustment of reactive circuits.

Another object is to provide a simplified variable bandwidth signal detector sharply responsive to alternating signals having relatively narrow signal spectrums.

These and other objects of the present invention, as will appear from a reading of the following specification, are accomplished by the addition of relatively few and inexpensive circuit components to the output of a conventional frequency discriminating circuit. The frequency discriminating circuit may be of the well known type suitable for use in an automatic frequency control system for controlling the operating frequency of an alternating signal generator.

As is well understood in the art, a conventional discriminating circuit has two independent signal response characteristics which, when differentially combined, produce the familiar S-shaped signal response characteristic suitable for the automatic frequency control of an alternating signal generator. Typical circuits are described in Terman, "Radio Engineer's Handbook," McGraw-Hill Book Company, Inc., 1943, pp. 585–588. In accordance with the present invention, additional circuit components are added to the discriminating circuit for selecting that one of the two signal response characteristics which produces the lesser output signal amplitude in response to a given input signal. In addition, variable signal threshold means are included for limiting the amplitude of the selected output signal. By adjustment of the signal threshold means, an output signal is produced for input signal frequencies within a selectable range of frequencies centered about the center frequency of the discriminator. A maximum amplitude output signal is generated when the input signal frequency equals the center frequency of the discriminator.

For a more complete understanding of the invention, reference should be had to the following specification and to the figures of which:

FIG. 1 is a simplified schematic diagram of a preferred embodiment adapted for use in an automatic frequency control system; and FIG. 2 is a plot of a response characteristic useful in explaining the operation of the preferred embodiment.

It will be recognized by those skilled in the art that the circuit designated by the dotted enclosure 1 is a conventional automatic frequency control system including an ordinary frequency discriminating circuit for controlling the operating frequency of oscillator 2. As is well understood, a direct potential is produced between point 3 and ground at the output of discriminator 4 having an amplitude related to the deviation in frequency of oscillator 2 from the center frequency of discriminator 4, and having a polarity determined by the sense of said frequency deviation. The potential at point 3 is applied via conductor 5 to the frequency control element of oscillator 2 to maintain the frequency of oscillator 2 at substantially the center frequency of discriminator 4.

FIG. 2 is a plot of the voltages that appear across resistors 6 and 7 at the output of discriminator 4 as the frequency of oscillator 2 deviates relative to the center frequency of discriminator 4. Curves $V_1$ and $V_2$ respectively represent the variation in potential across resistors 7 and 6 as the frequency of oscillator 2 varies from below to above the center frequency $f_c$ of discriminator 4. It will be observed that the peak values of the voltages developed across resistors 7 and 6 occur at different frequencies of the input signal derived from oscillator 2. Potentials of equal but lesser values are produced across resistors 7 and 6 when the frequency of oscillator 2 equals the center frequency $f_c$. In the conventional automatic frequency control arrangement represented in FIG. 1, the application of the potential appearing between point 3 and ground to oscillator 2 in effect differentially combines the voltage response curves $V_1$ and $V_2$ to produce a resultant characteristic whereby a zero voltage is developed between point 3 and ground at the center frequency $f_c$.

The circuit components identified by the dotted enclosure 8 are connected to discriminator 4 in accordance with the present invention to produce a maximum output potential $V_3$ at the center frequency $f_c$. It will be seen by reference to FIG. 2, that such a response characteristic may be achieved by always selecting that one of the output voltages $V_1$ and $V_2$ having the lesser amplitude value. Assuming, for example, that oscillator 2 were adjusted to operate at frequency $f_A$, a smaller voltage $V_2$ would be developed across resistor 6 of discriminator 4 whereas a larger voltage $V_1$ would be developed across resistor 7. In this case, the circuit components of enclosure 8 would select the voltage appearing across resistor 6 and make the selected voltage available across output terminals 9 and 10. On the other hand, if the frequency of oscillator 2 were adjusted to be $f_B$, a lesser voltage $V_1$ would appear across resistor 7. In this instance the voltage appearing across resistor 7 would be selected and applied between output terminals 9 and 10. As a result of the operation of voltage selector circuit 8, the frequency response characteristic as viewed from output terminals 9 and 10 can be represented by the heavy shaded portions of the curves $V_1$ and $V_2$, which heavy shaded portions are designated $V_3$.

Selector circuit 8 comprises back-to-back connected diodes 11 and 12 which are connected between point 3 and ground across output resistors 6 and 7 of discriminator 4. The junction between the anodes of diodes 11 and 12 is connected via diode 13 and variable potential source 16 to output terminal 10. Resistor 14 is connected across diode 11. Resistor 15 is connected across diode 12. The junction between resistors 6 and 7 is connected to output terminal 9. The polarity of source 16 is such as to inhibit the flow of current through diode 13.

In operation, assuming that the frequency of oscillator 2 is below the frequency $f_c$, a lesser voltage will be developed across resistor 6 whereas a greater voltage is developed across resistor 7 making the potential at point 3 negative with respect to ground. The negative voltage between point 3 and ground is applied across diodes 11 and 12 and resistors 14 and 15 whereby diode 11 is rendered conductive. The conduction of diode 11 effectively shortcircuits resistor 14 directly connecting the junction between diodes 11 and 12 to terminal 3. Thus, conductors 17 and 18 are connected directly across resistor 6, the potential of conductor 18 being positive with respect to the potential of conductor 17. Assuming that the positive potential of conductor 18 is a value sufficient to overcome the potential of source 16, diode 13 is rendered conductive making the potential at output terminal 10 positive with respect to output terminal 9.

In the event that the frequency of oscillator 2 is above the frequency $f_c$, a lesser voltage is developed across resistor 7 and a greater voltage is developed across resistor 6, making the potential of point 3 positive with respect to ground. In this case, diode 12 is rendered conductive placing conductors 17 and 18 directly across resistor 7, the potential of conductor 18 again being positive with respect to the potential of conductor 17. As before, when the potential of conductor 18 is sufficiently positive to overcome the potential of source 16, diode 13 conducts to make output terminal 10 positive with respect to output terminal 9.

The potential of source 16 is represented by dotted line 19 of FIG. 2. The level of line 19 is raised as the potential of source 16 is increased whereas the level of line 19 is lowered as the potential of source 16 is decreased. The effect of the adjustment of the potential of source 16 is to vary the frequency response bandwidth of discriminator 4 as modified by selector circuit 8. It will be seen that the potential between output terminals 9 and 10 rapidly diminishes as the frequency of oscillator 2 departs from the center frequency $f_c$ of discriminator 4. Consequently, the energization of a signal indicator such as indicator 20 connected between terminals 9 and 10 is sharply indicative of the operation of oscillator 2 at the desired center frequency $f_c$. The frequency selectivity of indicator 20 may be adjusted by variation of potential source 16.

It will be recognized that the variable bandwidth discriminator of the present invention is not limited to automatic frequency control applications such as represented by the typical embodiment of FIG. 1 but may be used solely as a detector of signals having a predominant frequency component within an adjustable range of the frequency $f_c$. The advantage of the automatic frequency control application is that a positive and sharply selective indication is produced by the operation of oscillator 2 at the desired frequency $f_c$ in return for the relatively few and inexpensive additional components designated by the dotted enclosure 8. The discriminating circuit 4 portion of the invention does not represent any additional design expense where it is already provided as part of an independently required AFC.

While the invention has been described in its preferred embodiments, it is understood that the words which have been used are words of description rather than of limitation and that changes within the purview of the appended claims may be made without departing from the true scope and spirit of the invention in its broader aspects.

What is claimed is:

1. A frequency sensitive detector having a pair of output terminals comprising a frequency discriminator having first and second output impedances each being connected to the other at one end, the interconnected ends of said first and second impedances being connected sole- rectifiers each having first and second terminals, a given ly to one of said output terminals, first, second and third rectifiers each having first and second terminals, a given terminal of said third rectifier being connected to one like terminal of each of said first and second rectifiers, the other terminals of said first and second rectifiers being connected across said first and second output impedances, third and fourth impedances connected respectively across said first and second rectifiers, and a source of potential for coupling the other terminal of said third rectifier to the other one of said output terminals, said source being so poled as to impede the flow of current through said third rectifier.

2. The frequency sensitive detector defined in claim 1 wherein said source of potential is variable so as to controllably impede the flow of current through said third rectifier.

3. A frequency sensitive detector having a pair of output terminals comprising a frequency discriminator having first and second output resistors each being connected to the other at one end, the interconnected ends of said output resistors being connected solely to one of said output terminals, first, second and third diodes each having first and second terminals, a given terminal of said third diode being connected to one like terminal of each of said first and second diodes, the other terminal of said first and second diodes being connected across said first and second output resistors, third and fourth resistors respectively connected across said first and second diodes, and a source of variable potential for coupling the other terminal of said third diode to the other one of said output terminals, said source being so poled as to impede the flow of current through said third diode.

4. A frequency sensitive detector having a pair of output terminals comprising a frequency discriminator having first and second output impedances each being connected to the other at one end, first and second rectifiers connected in series circuit across said first and second impedances, like terminals of said rectifiers being directly connected together, third and fourth impedances respectively connected across said first and second rectifiers, and means for coupling the junction between said first and second impedances and the junction between said third and fourth impedances to respective ones of said output terminals, said means for coupling including a third rectifier and a source of bias potential connected between one of said junctions and one of said output terminals, said source being poled so as to impede current flow through said third rectifier.

References Cited in the file of this patent

UNITED STATES PATENTS

| | | |
|---|---|---|
| 2,231,996 | Guanella et al. | Feb. 18, 1941 |
| 2,312,079 | Crosby | Feb. 23, 1943 |
| 2,377,326 | Crosby | June 5, 1945 |
| 2,423,229 | Crosby | July 1, 1947 |

FOREIGN PATENTS

| | | |
|---|---|---|
| 456,944 | Canada | May 24, 1949 |